United States Patent
Loehr et al.

(10) Patent No.: US 6,901,350 B2
(45) Date of Patent: May 31, 2005

(54) METHOD AND DEVICE FOR MONITORING THE FUNCTIONING OF A SYSTEM

(75) Inventors: Diethard Loehr, Holzmaden (DE); Axel Strommer, Brackenheim (DE)

(73) Assignee: Robert Bosch GmbH, Stuttgart (DE)

(*) Notice: Subject to any disclaimer, the term of this patent is extended or adjusted under 35 U.S.C. 154(b) by 59 days.

(21) Appl. No.: 10/183,890

(22) Filed: Jun. 27, 2002

(65) Prior Publication Data

US 2003/0023407 A1 Jan. 30, 2003

(30) Foreign Application Priority Data

Jun. 27, 2001 (DE) .......................................... 101 31 298
May 10, 2002 (DE) .......................................... 102 20 811

(51) Int. Cl.[7] .............................................. G06F 11/30
(52) U.S. Cl. ...................... 702/186; 702/188; 702/183; 714/47
(58) Field of Search ...................... 706/47, 49; 702/186, 702/122, 123, 182–185, 187, 188, 116, FOR 103, FOR 104, FOR 123, FOR 129, FOR 134, FOR 135, FOR 155, FOR 170, FOR 171; 714/25, 47; 303/122, 122.01–122.04, 122.05, 122.08, 176, 20, 22.1, 22.4, 25; 701/1, 29, 33, 36, 39, 43, 48, 62, 70, 71, 76, 92, 97; 340/3.1, 3.43, 286.01; 700/1–3, 9, 19, 20, 21, 79, 275, 277

(56) References Cited

U.S. PATENT DOCUMENTS

| | | | |
|---|---|---|---|
| 5,436,837 A | * | 7/1995 | Gerstung et al. ............. 701/29 |
| 5,448,722 A | | 9/1995 | Lynne et al. ................... 706/49 |
| 5,500,944 A | | 3/1996 | Yoshida ........................ 714/47 |
| 5,619,621 A | | 4/1997 | Puckett ......................... 706/47 |
| 5,880,568 A | * | 3/1999 | Bederna et al. ............. 318/563 |
| 6,154,688 A | * | 11/2000 | Dominke et al. ............... 701/1 |
| 6,299,261 B1 | * | 10/2001 | Weiberle et al. .............. 303/20 |
| 6,628,993 B1 | * | 9/2003 | Bauer .......................... 700/20 |

FOREIGN PATENT DOCUMENTS

| | | |
|---|---|---|
| DE | 41 14 999 | 11/1992 |
| DE | 44 38 714 | 5/1996 |
| DE | 195 00 188 | 7/1996 |
| DE | 197 49 002 | 8/1998 |
| DE | 198 26 131 | 12/1999 |
| EP | 0 482 523 | 4/1992 |

* cited by examiner

Primary Examiner—Hal Wachsman
(74) Attorney, Agent, or Firm—Kenyon & Kenyon

(57) ABSTRACT

A method and a device for monitoring the functioning of a system by checking input signals, output signals and at least one function unit of the system. The system includes at least one lower-level subsystem and/or is a component of a higher-level system. The system includes components implemented in the form of hardware, including sensors, actuators and/or function computers. An intended function of the system is subdivided hierarchically as a function of the complexity of the function into at least one subsystem function which is in turn subdivided into at least one function unit, and the method is structured hierarchically into multiple monitoring layers.

11 Claims, 4 Drawing Sheets

METHOD AND DEVICE FOR MONITORING THE FUNCTIONING OF A SYSTEM

FIELD OF THE INVENTION

The present invention relates to a method of monitoring the functioning of a system by checking input signals, output signals and at least one function unit of the system. The system includes at least one lower-level subsystem and/or is a component of a higher-level system. This system includes components implemented in the form of hardware, including sensors, actuators and/or function computers.

The present invention also relates to a memory element for a device for monitoring the functioning of a system. A computer program capable of running on a computer, in particular on a microprocessor, is stored on the memory element. The memory element may be configured, for example, as a read-only memory, a random access memory or a flash memory.

In addition, the present invention relates to a computer program capable of running on a computer, in particular on a microprocessor.

Finally, the present invention relates to a device for monitoring the functioning of a system which includes at least one lower-level subsystem and/or which is a component of a higher-level system. This system includes components implemented in the form of hardware, including sensors, actuators and/or function computers. The device includes an arrangement for checking input signals, output signals and at least one function unit of the system.

BACKGROUND INFORMATION

The term system according to the exemplary embodiment of the present invention is understood to refer to any desired control device, for example, in particular an automotive control device. This system is configured, for example, as a control device for electric battery management (EBM). It includes subsystems configured as a computer unit, an ASIC (Application Specific Integrated Circuit) or as a current sensor, for example. In addition, this system includes units configured as an EBM algorithm or as a battery simulation, for example, and parts which include calculation of an alternator voltage setpoint or any desired mathematical or trigonometric functions, for example. The EBM control device is part of a higher-level system in the form of a motor vehicle. In addition to the EBM control device, a plurality of other systems, e.g., an engine control device and a transmission control device, are also provided in the motor vehicle.

To guarantee correct functioning of a system, it is referred to in other prior systems to rely on monitoring of input signals, output signals and function units of the system. German Published Patent Application No. 41 14 999 discusses a method of monitoring the functioning of an automotive control device. The intended function of the control device is executed in a microprocessor of the control device. In parallel with that, the same intended function is executed at least partially in a monitoring device. The output signals of the microcomputer and the monitoring device are compared and, depending on the result of this comparison, a determination is made as to whether or not the control device is functioning correctly. If faulty functioning of the control device is detected, appropriate substitute measures are instituted. The monitoring method discussed in this publication is based strongly on the hardware of the system to be monitored and is highly inflexible. The monitoring method discussed in the publication is not easily implemented in another control device having a different intended function. In addition, the monitoring method occurring in the monitoring device will also have to be revised completely and adapted to the revised function of the other control device. This may also include structural revision of the monitoring method.

German Published Patent Application No. 44 38 714 discusses a method of monitoring the functioning of a control device. A microcomputer of the control device is subdivided into a function level, a monitoring level and a check level. The intended function of the control device is executed in the function level. In the monitoring level, the function executed is checked, for example, by a threshold comparison or a plausibility check. In the monitoring level, the (total) intended function of the control device is therefore not executed, and instead only specific monitoring functions are executed. To nevertheless be able to detect faulty functioning of the system with adequate reliability, the additional check level is provided in which a check of the components of the system implemented in the hardware (e.g. memory elements or the microprocessor) is performed, and correct functioning of the microprocessor may be checked by using a question-answer communication. In the monitoring method discussed in this publication, it may be disadvantageous that the structure of the method is based on the hardware of the system to be monitored and is very inflexible. To be able to apply the monitoring method to a different control device having a different intended function, it is believed that the monitoring method discussed in this publication will first have to be revised completely and adapted to the new hardware and software conditions. However, this may be complicated and expensive.

It is believed that the structure of the method of monitoring the functioning of a system referred to in these two publications is based exclusively on the hardware of the system and is independent of the complexity of the function executed by the system to be monitored. If the monitoring method discussed in these publications is used to monitor functions having a high complexity, then the method would theoretically be structured exactly as indicated in these publications. However, due to the increasing complexity of the function executed as intended by the system to be monitored, it is believed that the structure of the monitoring method is also becoming more complex and increasingly difficult to understand. It is also believed that the monitoring concepts discussed in these publications may be unsuitable for complex functions. In particular in the case of the monitoring concepts, the fault occurring in the event of a fault may not be assignable to a specific function of the system. It is believed that this makes both fault diagnosis and selection of a suitable substitute function much more difficult.

SUMMARY OF THE INVENTION

Therefore, it is an object of the exemplary embodiment of the present invention to provide for monitoring and diagnosis of systems which is also applicable to other systems without any great effort.

The exemplary embodiment and/or exemplary method of the present invention provides that an intended function of the system be subdivided hierarchically as a function of the complexity of the function into at least one subsystem function, which is in turn subdivided into at least one function unit, and this method is structured into:
  a first monitoring layer in which one of the function units of the system is checked, taking into account input signals and/or output signals of the function unit;

a second monitoring layer at a higher level than the first monitoring layer in which the function unit is additionally checked, taking into account input signals and/or output signals of the subsystem assigned to the function unit; and at least one additional monitoring layer at a higher level than the second monitoring layer in which the function unit is additionally checked, taking into account input signals and/or output signals of the system.

The exemplary monitoring method according to the present invention is modular in configuration and thus may easily be expanded and used for monitoring a wide variety of systems of varying complexity. The structure of the exemplary monitoring method according to the present invention does not differ fundamentally between the hardware and software implementations of the functions of the system to be monitored, and thus it is universally applicable. The structure of the exemplary monitoring method according to the present invention is based purely on the function units of the system and therefore also depends on the complexity of the function executed as intended by the system to be monitored (e.g., control or regulatory functions).

Due to the modular configuration and structuring of the exemplary monitoring method according to the present invention, on the whole this yields a clear, comprehensible structure of the monitoring method and ultimately a greater customer acceptance. In addition, faults occurring may be assigned more easily and unambiguously to certain monitoring layers and even to different function units within the monitoring layers. This is achieved by the fact that faults involving different function units of the same monitoring layer are isolated from one another. Therefore, this greatly simplifies and significantly accelerates the search for the cause of a fault. In addition, the accuracy and reliability of troubleshooting are improved. The present invention thus also relates to a vertical structuring of a monitoring method for a system.

The manner in which the monitoring of the functions is to be implemented specifically in the individual monitoring layers is not limited by the exemplary monitoring method according to the present invention. Components implemented in hardware may be monitored, e.g., by a watchdog, a core test or another monitoring module.

The intended function of the system to be monitored is subdivided into multiple function layers, depending on the complexity of the function. At the very top is the actual system function. The system function is an electronic battery management (EBM), for example. This system function is subdivided into at least one subsystem function, which is configured as the function of a microcomputer or a current sensor, for example. In the selected examples, the system function and subsystem function are implemented in the hardware. However, it is also conceivable to select examples implemented through software for this function.

This subsystem function is in turn subdivided into at least one function unit, which is configured as a software functionality (e.g., battery simulation, zero-signal current management (ZCM) or dynamic energy management (DYN)) or as a hardware functionality (e.g., current measurement, voltage measurement). Depending on the complexity of the intended function of the system, this subdivision may be continued by introducing additional function layers as desired. For example, one function unit may be subdivided into at least one subfunction, which, in the example of dynamic energy management, may be a simple mathematical or trigonometric function or an alternator voltage setpoint calculation.

Starting from the first monitoring layer, the complexity of the monitoring increases from one layer to the next. In the first monitoring layer, a function unit of the system is monitored on the basis of input signals and/or output signals of the unit in question, i.e., on the basis of the function unit in question. In the second monitoring layer, the function unit is additionally monitored on the basis of input signals and/or output signals from other function units within the subsystem to which the function unit in question is assigned. In the third monitoring layer, the function unit of the system is additionally monitored on the basis of input signals and/or output signals of additional subsystems within the system.

If the system function also includes other function layers beneath the first function layer (e.g., partial functions beneath the function units), then in the first monitoring layer, a subfunction of the system is monitored on the basis of input signals and/or output signals of the unit in question, i.e., on the basis of the subfunction in question. In the second monitoring layer, the subfunction of the system is additionally monitored on the basis of input signals and/or output signals of additional subfunctions within the function unit to which the subfunction in question is assigned. In the third monitoring layer, the subfunction is additionally monitored on the basis of input signals and/or output signals from additional function units within the subsystem to which the subfunction in question is assigned. In another fourth monitoring layer, the subfunction is additionally monitored on the basis of input signals and/or output signals of additional subsystems within the system. Thus, the greater the complexity of the structure of the function of the system, the greater also the complexity of the structure of the exemplary monitoring method according to the present invention.

According to an exemplary embodiment of the present invention, it is described that the function unit be checked by checking the input signals and/or output signals of the function unit, the subsystem and/or the system for whether they exceed a maximum value or fall below a minimum value and/or by checking the gradient of the input signals and/or output signals for whether it exceeds a maximum value or falls below a minimum value.

According to an exemplary embodiment of the present invention, it is described that the function units of the system to be monitored be subdivided into safety-relevant function networks whose faulty functioning constitutes a safety risk which is above a preselectable limiting risk and into additional function networks whose faulty functioning constitutes a safety risk which is less than or equal to the limiting risk.

In the case of safety-relevant function networks, a sufficiently rapid and reliable reaction, e.g., initiation of a substitute function or a suitable shutdown strategy, is necessary to guarantee the safety of the system. In the case of additional function networks, enough time is available to respond accordingly, i.e., there is no state endangering the safety of the system in the event of failure of the substitute function.

According to another exemplary embodiment of the present invention, it is described that, in the case of faulty functioning of a function network, substitute measures be selected as a function of whether a function unit of a safety-relevant function network or of an additional function network has faulty functioning.

Substitute measures include emergency operation and/or emergency shutdown of an affected component which is implemented in the form of hardware, an affected function and/or the system affected.

The exemplary method according to the present invention is applied to all function units of the system. This means that each function unit of the system is checked by a monitoring method structured in the manner described here. This permits a reliable statement to be made regarding the functioning of the system as a whole.

Proper functioning of the system is ascertained when all the function units of the system are functioning properly. As soon as one of the function units checked is not functioning properly, the entire system is recognized as faulty. In a fault case, a suitable substitute measure is selected and executed. The substitute measure may be executed in addition to or instead of the function of the defective unit in question (function unit).

As another implementation of the object of the present invention, starting from the method of the type defined in the preamble, an intended function of the system is subdivided hierarchically as a function of the complexity of the function into at least one subsystem function which is in turn subdivided into at least one function unit, and in a first monitoring layer, one of the function units of the system is checked, taking into account input signals and/or output signals of the function unit;

in a second monitoring layer at a higher level than the first monitoring layer, the function unit is additionally checked, taking into account input signals and/or output signals of the subsystem assigned to the function unit; and in at least one additional monitoring layer at a higher level than the second monitoring layer, the function unit is additionally checked, taking into account input signals and/or output signals of the system.

Implementation of the exemplary method according to the present invention in the form of a memory element, which is provided for a device for monitoring the functioning of a system, is of particular importance. A computer program capable of running on a computer, in particular on a microprocessor, and suitable for executing the exemplary method according to the present invention is stored on the memory element. In this case, the exemplary embodiment and/or exemplary method of the present invention is thus implemented by a computer program stored on the memory element such that memory element provided with the computer program constitutes the present invention in the same manner as the method for whose execution the computer program is suitable. In particular, an electric memory medium such as a read-only memory, a random access memory or a flash memory may be used as the memory element.

In another exemplary embodiment and/or exemplary method of the present invention, starting from the computer program of the type defined in the preamble, the computer program is suitable for executing the exemplary method according to the present invention when it is run on the computer. The computer program is stored on a memory element, in particular a read-only memory, a random access memory or a flash memory.

Finally, in another exemplary embodiment and/or exemplary method of the present invention, an intended function of the system is subdivided hierarchically as a function of the complexity of the function into at least one subsystem function which is in turn subdivided into at least one function unit, and the device includes a first monitoring layer which checks one of the function units of the system, taking into account input signals and/or output signals of the function unit;

a second monitoring layer at a higher level than the first monitoring layer which additionally checks the function unit, taking into account input signals and/or output signals of the subsystem assigned to the function unit; and at least one additional monitoring layer at a higher level than the second monitoring layer which additionally checks the function unit, taking into account input signals and/or output signals of the system.

The various layers may be implemented in hardware or software. They include, for example, a watchdog, a core test or another monitoring module. The layers may also include comparators may also check the various input signals and/or output signals for whether they exceed a maximum value or fall below a minimum value. In addition, such layers may include a gradient forming arrangement, so that the comparator then checks the gradients of the input signals and/or output signals for whether they exceed a maximum value or fall below a minimum value.

DETAILED DESCRIPTION

The present invention relates to a monitoring method for monitoring the functioning of any desired system, the monitoring method is structured vertically as a function of the complexity of the intended function of the system to be monitored. The intended function of the system is, for example, a control or regulatory function. The exemplary structure according to the present invention is independent of the hardware of the system and is extremely flexible.

The intended function of system 1 to be monitored will be considered as broken down into its elements. The smallest unit of function of system 1 shall be known as a function element which is monitored, if necessary, by a monitoring function MF. However, monitoring need not be implemented in the smallest units but instead may also be implemented in modules composed of multiple function elements.

Figure 1:
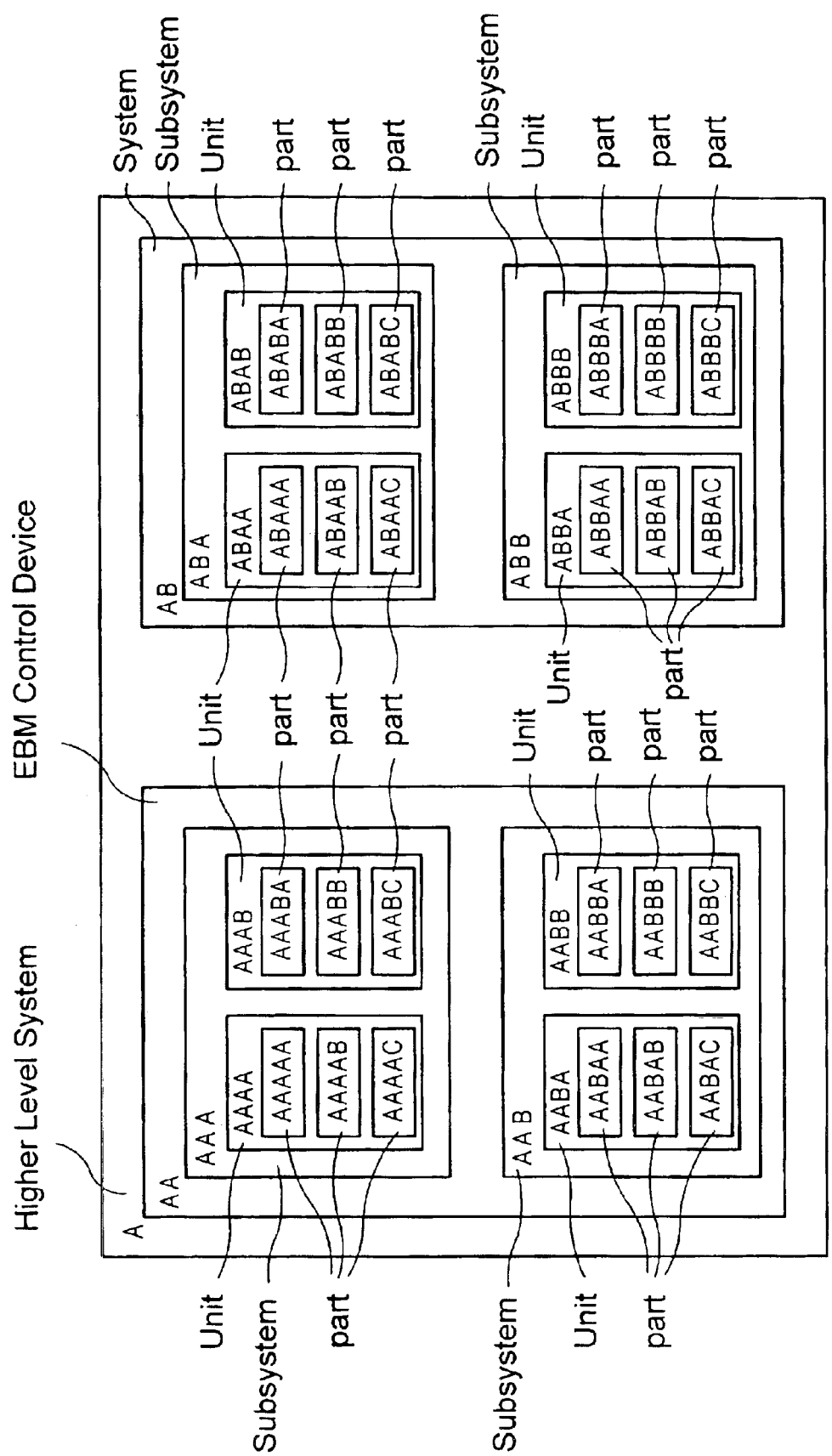
FIG. 1 shows a structure of a system monitored by the exemplary monitoring method according to the present invention.

FIG. 1 shows a higher-level system A in the form of a motor vehicle. Higher-level system A includes various systems, including an electric battery management (EBM) control device which is labeled as AA. In addition to EBM control device AA, another system AB is also a component of motor vehicle A. Additional system AB may be, for example, an engine control device or a transmission control device. EBM control device AA is subdivided into two subsystems AAA and AAB, configured, for example, as a computer 2 (see FIG. 8) or a memory element 3. Additional system AB is subdivided into subsystems ABA and ABB.

Subsystems AAA, AAB are in turn subdivided into multiple units AAAA, AAAB, AABA, AABB. The same thing is also true of subsystems ABA and ABB and additional system AB. Units AAAA, AAAB, AABA, AABB are, for example, configured as zero-signal current management (ZCM) or dynamic energy management (DYN) systems.

Units AAAA, AAAB, AABA, AABB are in turn subdivided into various parts. Unit AAAA is subdivided into parts AAAAA, AAAAB and AAAAC and unit AAAB is subdivided into parts AAABA, AAABB and AAABC. Unit AABA is subdivided into parts AABAA, AABAB and AABAC and unit AABB is subdivided into parts AABBA, AABBB and AABBC. The same thing is also true of units ABAA, ABAB, ABBA and ABBB of subsystems ABA and ABB of additional subsystem AB. The units include an alternator voltage calculating unit, for example.

The intended function of system AA to be monitored is thus subdivided into multiple function layers as a function of the complexity of the function. The actual system function (in system AA) is provided at the very top. The system function may be, for example, an electronic battery management (EBM) function. The system function is subdivided into at least one subsystem function (in subsystems AAA and AAB) which is configured as the function of a microcomputer or a current sensor, for example. The subsystem functions are in turn subdivided into at least one function unit each (in units AAAA, AAAB, AABA and AABB) which is, for example, a software functionality (battery simulation, zero-signal current management or dynamic current management). This subdivision is continued as far as desired, depending on the complexity of the function of the system. For example, a function unit may be further subdivided into at least one subfunction (in parts AAAAA, AAAAB, AAAAC, AAABA, AAABB, AAABC, AABAA, AABAB, AABAC, AABBA, AABBB and AABBC) which is embodied as a simple trigonometric function or as an alternator voltage setpoint calculation in the example of dynamic current management.

Figure 2:
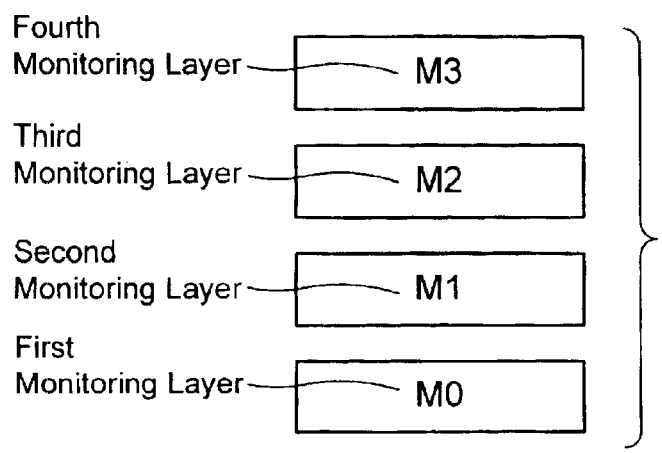
FIG. 2 shows a structure of an exemplary monitoring method according to the present invention in a first exemplary embodiment.
Figure 4:
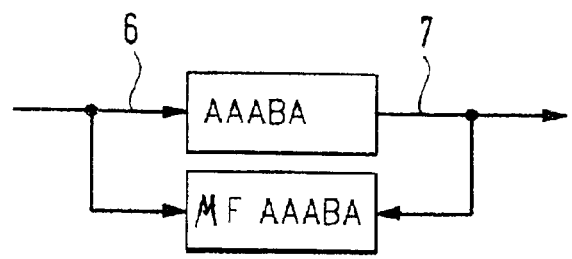
FIG. 4 shows a function diagram for a first monitoring level of the exemplary method according to the present invention.

The exemplary method according to the present invention begins with this functional structuring of the intended function of system AA, AB. FIG. 2 shows a layer model including various monitoring layers of an exemplary monitoring method according to the present invention in a first exemplary embodiment. Starting from a (lower) first monitoring layer M0, the complexity of monitoring increases from one layer to the next. The consideration of the exemplary method according to the present invention starts from a certain unit of system AA. In the present case, this is subfunction AAABA (see FIG. 4). In first monitoring layer M0, subfunction AAABA is checked on the basis of input signals 6 and/or output signals 7 of this subfunction AAABA by a monitoring function MF AAABA assigned to this subfunction AAABA.

Figure 5:
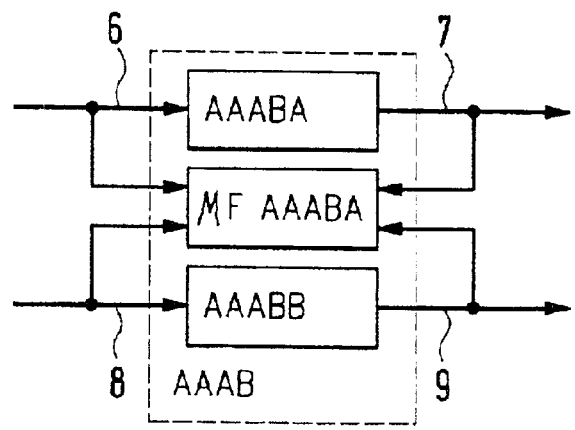
FIG. 5 shows a function diagram for a second monitoring level of the exemplary method according to the present invention.

In a second monitoring layer M1 at a higher level than first monitoring layer M0 (see FIG. 5), subfunction AAABA is additionally checked on the basis of input signals 8 and/or output signals 9 of an additional subfunction AAABA of that function unit AAAB to which subfunction AAABA in question is assigned. Additional subfunction AAABB is part of the same function unit AAAB as subfunction AAABA in question.

Figure 6:
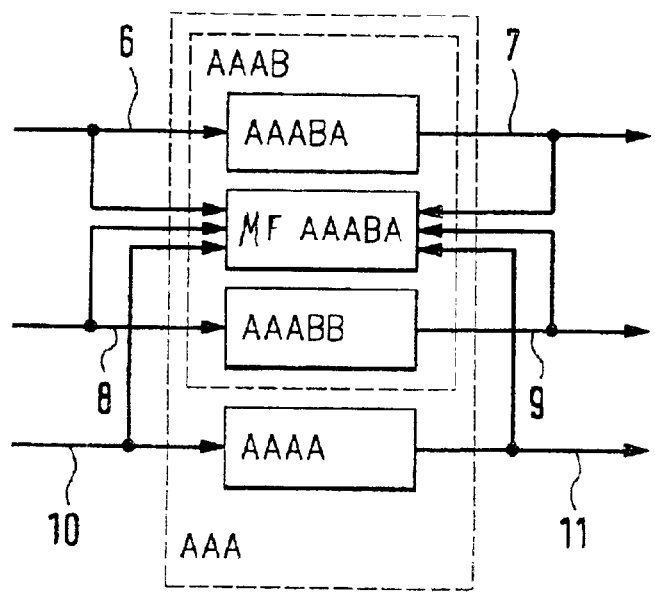
FIG. 6 shows a function diagram for a third monitoring level of the exemplary method according to the present invention.

In a third monitoring layer M2 at a higher level than second monitoring layer M1 (see FIG. 6), subfunction AAABA is additionally checked on the basis of input signals 10 and/or output signals 11 of another function unit AAAA different from that function unit AAAB to which subfunction AAABA in question is assigned. Function unit AAAA is part of subsystem AAA to which subfunction AAABA in question is also assigned.

Figure 7:
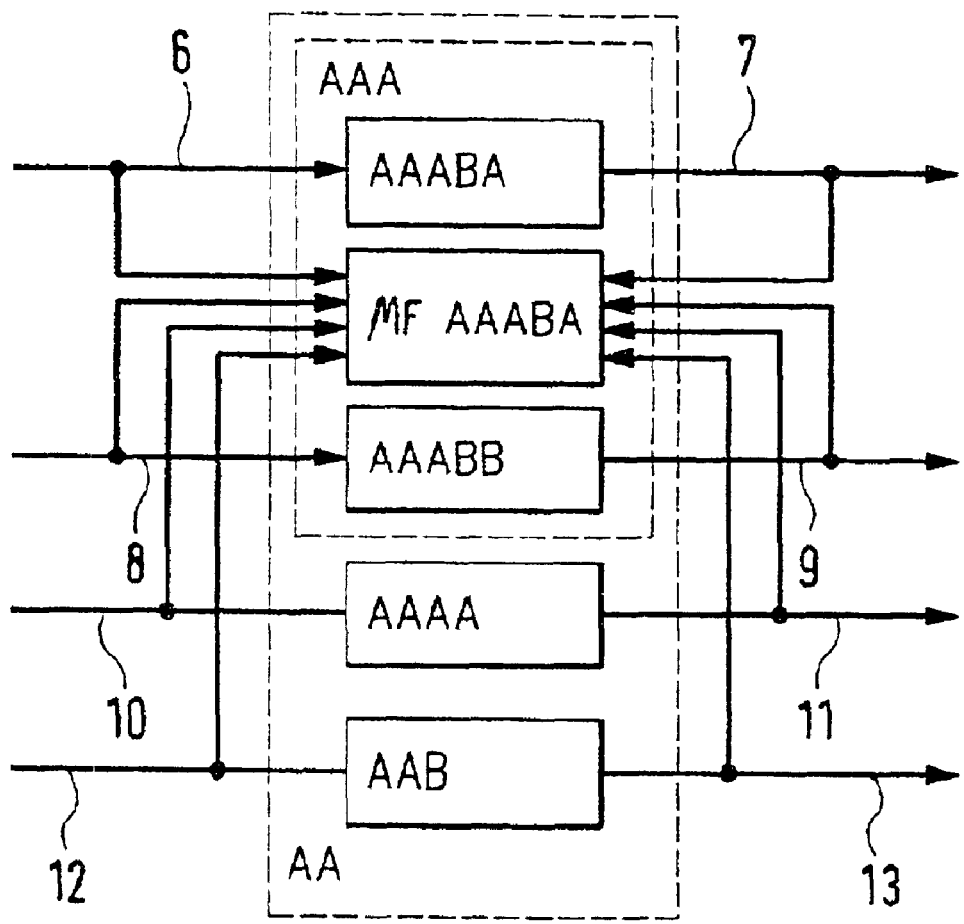
FIG. 7 shows a function diagram for a fourth monitoring level of the exemplary method according to the present invention.

In a fourth monitoring layer M3 at a higher level than third monitoring layer M2 (see FIG. 7), subfunction AAABA is additionally checked on the basis of input signals 12 and/or output signals 13 of another subsystem AAB different from that subsystem AAA to which subfunction AAABA in question is assigned. Subsystem AAB is part of system AA to which subfunction AAABA in question is also assigned.

Monitoring sequences which are run through by multiple monitoring functions MF may be made available for these monitoring functions MF at a central location. Therefore, these monitoring sequences are available to all monitoring functions MF for a fault memory entry, for example. Individual monitoring functions MF check certain basic functionalities (e.g., operating overvoltage detection) of the function units and may be reused for other monitoring functions MF without any great effort. A communications protocol of a monitoring function MF via which various monitoring functions MF exchange information may also be reused for other monitoring functions MF.

The exemplary monitoring method according to the present invention may be used on any desired systems 1. Any faults that occur are isolated from the various function units of the same monitoring layer. In the search for the causes of faults, the fault sources may thus be determined more easily. The exemplary monitoring method according to the present invention permits easier unambiguous assignment of faults to the individual monitoring layers and thus to the function units of system 1. In each monitoring layer, only input signals and/or output signals are monitored, so on the whole fewer fault sources are available on the basis of the monitoring in comparison with other prior systems, and these signals may ultimately also be determined more easily and more accurately.

The minimum requirement of monitoring of a system 1 is that it may be recognized when system 1 is no longer performing as specified. In the ideal case, it may also be ensured that system 1 is also performing as specified when faults occur. This presupposes that redundancies have been provided, these are generally implemented for cost reasons only in systems classified as relevant to safety. In all other systems 1, monitoring may therefore be limited to detecting when system 1 is no longer performing as specified.

The term specification in this context is understood to refer to the sum of all requirements made of a system. Requirements may include, for example, "fail-safe," "fault tolerance," "functional safety" or a "control device of unlimited functionality for operating voltages between 6 volts and 20 volts." Since these requirements are different for each system, valid monitoring may be characterized in that it is flexibly applicable to different systems having different requirements. This requires a corresponding function structure which may allow use of the monitoring components for various systems even if they meet different requirements (with regard to safety).

The monitoring of system 1 runs parallel to the intended function of system 1 and must not restrict its execution in any manner, e.g., by using computing capacity. System 1 may react directly to the results of this monitoring (faults under some circumstances). In addition, faults may be stored permanently and used for fault analysis either immediately or later.

The diagnosis is that part of the monitoring which may usually be called up in a workshop by using a corresponding diagnostic tester. This includes, for example, sending stored faults for analysis. A suitable interface is necessary for this purpose. This interface is based on a standardized protocol and may allow for control of a suitable diagnostic tester. A bidirectional data flow between the control device and the diagnostic tester is thus allowed.

Diagnosis allows for:

a) reading out and erasing a fault memory, b) reading out output signals of selected functions (e.g., sensor variables), c) altering the value of input signals of selected functions (e.g., for controlling an actuator) and d) storing control device-specific data (e.g., a serial number).

In addition, diagnosis includes calculation of historical data, i.e., data series compiled over a relatively long period of time and needed for analysis of the system performance (data supporting development). Historical data is not necessary for the function of the system.

According to the exemplary embodiment and/or exemplary method of the present invention, the components of system 1 are classified in a particular manner, as shown in FIG. 1. A distinction is not made according to the manner in which the component is implemented (hardware or software). Instead, the components of system 1 are classified only according to their functionality.

Figure 3:
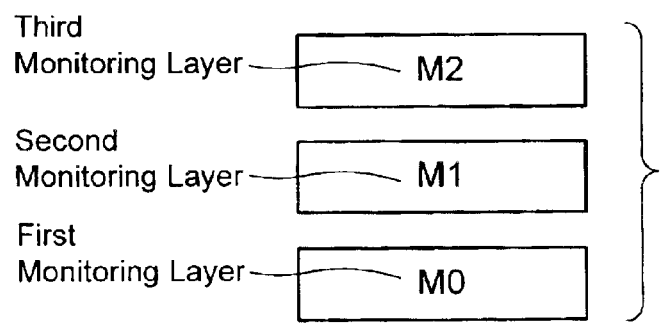
FIG. 3 shows a structure of an exemplary monitoring method according to the present invention in a second exemplary embodiment.

FIG. 3 shows a layer model including various monitoring layers of an exemplary monitoring method according to the present invention in a second exemplary embodiment. Starting from a (bottom) first monitoring layer M0, the complexity of monitoring increases from one layer to the next. The consideration of the exemplary method according to the present invention starts from a certain unit of system AA. In the present case, this is one of function units AAAA, AAAB, AABA, AABB.

In this layer model, in first monitoring layer M0, function unit AAAA, AAAB, AABA or AABB in question is checked, taking into account input signals and/or output signals of this function unit by a monitoring function MF assigned to this function unit. In a second monitoring layer M1 at a higher level than first monitoring layer M0, function unit AAAA, AAAB, AABA or AABB in question is additionally checked, taking into account input signals and/or output signals of that subsystem AAA or AAB to which the function unit in question is assigned. In a third monitoring layer M2 at a higher level than second monitoring layer M1, function unit AAAA, AAAB, AABA or AABB in question is additionally monitored by taking into account input signals and/or output signals of system AA to which the function unit in question is assigned and whose functionality is to be checked. If all monitored function units AAAA, AAAB, AABA and AABB of system AA are found to be functioning properly, it is deduced from this that system AA on the whole is in order.

Figure 8:
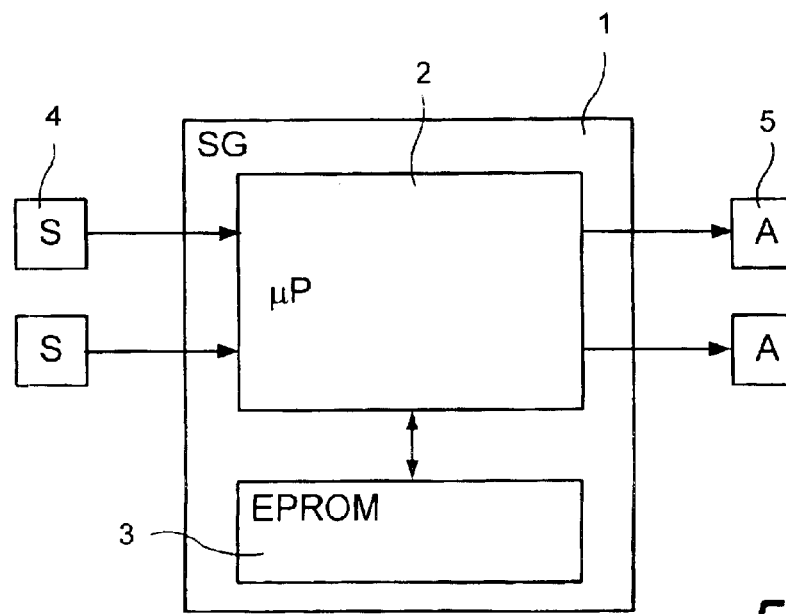
FIG. 8 shows a control device for executing the exemplary monitoring method according to the present invention.

FIG. 8 shows a system 1 configured as a control device whose functioning is monitorable on the basis of the exemplary method according to the present invention. Control device 1 includes a memory element 3, configured as an electric memory medium, in particular an erasable and programmable read-only memory (EPROM). A computer program suitable for executing the exemplary monitoring method according to the present invention when run on a computer 2 of control device 1 is stored on memory element 3. Computer 2 is configured in particular as a microprocessor. To execute the computer program on computer 2, the program is transferred either as a whole or by command from memory element 3 to computer 2.

Vertical structuring of the exemplary monitoring method according to the present invention is implemented in the computer program in particular in such a manner that the method is subdivided into multiple monitoring layers M0, M1, M2, . . . , Mn, depending on the complexity of system 1.

Control device 1 receives input signals from sensors 4 and delivers output signals to actuators 5. Output signals are generated as part of the processing of a control and/or regulating program in microprocessor 2 in fulfillment of the intended functions of control device 1. The control and/or regulating program may be stored in memory element 3 of control device 1 and loaded as a whole or by command into microprocessor 1 for processing. The control and/or regulating program and the computer program for execution of the exemplary monitoring method according to the present invention may be combined into one common program.

What is claimed is:

1. A method of monitoring a functioning of a system, the system including at least one lower-level subsystem, and the system being a component of a higher-level system, the system including components implemented as hardware, including at least one of at least one sensor, at least one actuator, and at least one function computer, the method comprising:

checking at least one input signal, at least one output signal and at least one function unit of the system; and subdividing hierarchically an intended function of the system as a function of the complexity of the intended function, the intended function being subdivided into at least one subsystem function that is subdivided into at least one function unit;

wherein:

in a first monitoring layer, the at least one function unit of the system is checked on the basis of at least one of at least one input signal and at least one output signal of the at least one function unit;

in a second monitoring layer, at a higher level than the first monitoring layer, the at least one function unit is checked on the basis of at least one of at least one input signal and at least one output signal of at least one subsystem assigned to the at least one function unit; and in at least one additional monitoring layer, at a higher level than the second monitoring layer, the at least one function unit is checked on the basis of at least one of the at least one input signal and the at least one output signal of the system.

2. The method of claim 1, wherein the at least one function unit is checked by at least one of checking whether at least one of the at least one input signal of the at least one function unit, the at least one output signal of the at least one function unit, the at least one input signal of the at least one subsystem, the at least one output signal of the at least one subsystem, the at least one input signal of the system and the at least one output signal of the system one of exceed a corresponding predetermined maximum value and fall below a corresponding predetermined minimum value and checking whether a gradient of at least one of the at least one input signal of the at least one function unit, the at least one output signal of the at least one function unit, the at least one input signal of the at least one subsystem, the at least one output signal of the at least one subsystem, the at least one input signal of the system and the at least one output signal of the system one of exceeds the corresponding predetermined maximum value and falls below the corresponding predetermined minimum value.

3. The method of claim 1, wherein the at least one function unit of the system to be monitored is subdivided into at least one safety-relevant function network whose faulty functioning constitutes a safety risk that is above a preselectable limiting risk, and into an additional function network whose faulty functioning constitutes a safety risk that is no greater than the preselectable limiting risk.

4. The method of claim 3, wherein in the case of a faulty functioning of at least one of the at least one safety-relevant function network and the additional function network, substitute measures are selected as a function of whether one of a function unit of the at least one safety-relevant function network and the additional function network has faulty functioning.

5. The method of claim 4, wherein the substitute measures include at least one of emergency operation and emergency shutdown.

6. The method of claim 1, wherein proper functioning of the system is ascertained when all function units of the system are functioning properly.

7. A computer-readable medium for storing a computer program executable by a computer, the computer program including program code for performing a method for monitoring a system, the system including at least one lower-level subsystem, and the system being a component of a higher-level system, the system including components implemented as hardware, including at least one of at least one sensor, at least one actuator, and at least one function computer, the computer program being operable to perform the method, the method including:
  checking at least one input signal, at least one output signal and at least one function unit of the system; and
  subdividing hierarchically an intended function of the system as a function of the complexity of the intended function, the intended function being subdivided into at least one subsystem function that is subdivided into at least one function unit;
  wherein:
    in a first monitoring layer the at least one function unit of the system is checked on the basis of at least one of at least one input signal and at least one output signal of the at least one function unit;
    in a second monitoring layer, at a higher level than the first monitoring layer, the at least one function unit is checked on the basis of at least one of at least one input signal and at least one output signal of at least one subsystem assigned to the at least one function unit; and
    in at least one additional monitoring layer, at a higher level than the second monitoring layer, the at least one function unit is checked on the basis of at least one of the at least one input signal and the at least one output signal of the system.

8. The computer-readable medium of claim 7, wherein the computer-readable medium is a memory of the computer.

9. The computer-readable medium of claim 8, wherein the memory of the computer is one of a read-only memory, a random access memory and a flash memory.

10. The computer-readable medium of claim 7, wherein the computer is a microprocessor.

11. A device for monitoring a system, the system including at least one lower-level subsystem, and the system being a component of a higher-level system, the system including components implemented as hardware, including at least one of at least one sensor, at least one actuator and at least one function computer, the device comprising:
  a checking arrangement to check at least one input signal, at least one output signal and at least one function unit of the system;
  a first monitoring layer arrangement to check the at least one function unit of the system the basis of at least one of at least one input signal and at least one output signal of the at least one function unit;
  a second monitoring layer arrangement, at a higher level than the first monitoring layer, to check the at least one function unit on the basis of at least one of at least one input signal and at least one output signal of at least one subsystem assigned to the at least one function unit; and
  at least one additional monitoring layer arrangement, at a higher level than the second monitoring layer, to check the at least one function unit on the basis of at least one of the at least one input signal and the at least one output signal of the system; and
  a subdividing arrangement to subdivide hierarchically an intended function of the system as a function of the complexity of the intended function, the intended function being subdivided into at least one subsystem function that is subdivided into the at least one function unit.

* * * * *